United States Patent
Seo et al.

(10) Patent No.: US 8,101,527 B2
(45) Date of Patent: Jan. 24, 2012

(54) DICING FILM HAVING SHRINKAGE RELEASE FILM AND METHOD FOR MANUFACTURING SEMICONDUCTOR PACKAGE USING THE SAME

(75) Inventors: Joon Mo Seo, Seoul (KR); Hyuk Soo Moon, Gyeonggi-do (KR); Cheol Jong Han, Gyeonggi-do (KR); Jong Geol Lee, Gyeonggi-do (KR); Kyung Tae Wi, Seoul (KR)

(73) Assignee: LG Innotek Co. Ltd., Seoul (KR)

( * ) Notice: Subject to any disclaimer, the term of this patent is extended or adjusted under 35 U.S.C. 154(b) by 0 days.

(21) Appl. No.: 12/758,505

(22) Filed: Apr. 12, 2010

(65) Prior Publication Data

US 2010/0197078 A1      Aug. 5, 2010

Related U.S. Application Data

(62) Division of application No. 11/009,246, filed on Dec. 10, 2004, now Pat. No. 7,968,977.

(30) Foreign Application Priority Data

Mar. 25, 2004   (KR) .................. 10 2004 0020434

(51) Int. Cl.
*H01L 21/31* (2006.01)

(52) U.S. Cl. ........ 438/761; 438/460; 438/464; 438/763; 438/780; 438/781

(58) Field of Classification Search .................. 438/460, 438/464, 761, 763, 779, 780, 781, FOR. 386
See application file for complete search history.

(56) References Cited

U.S. PATENT DOCUMENTS

| | | | |
|---|---|---|---|
| 4,961,804 A | 10/1990 | Aurichio | |
| 5,110,388 A | 5/1992 | Komiyama et al. | |
| 5,304,418 A | 4/1994 | Akada et al. | |
| 5,928,827 A * | 7/1999 | Rajan | 430/124.51 |
| 6,225,194 B1 * | 5/2001 | Noguchi et al. | 438/464 |

* cited by examiner

*Primary Examiner* — N Drew Richards
*Assistant Examiner* — Joannie A Garcia
(74) *Attorney, Agent, or Firm* — Vidas, Arrett & Steinkraus, P.A.

(57) ABSTRACT

The present invention relates to a dicing film having an adhesive film for dicing a wafer and a die adhesive film, which are used for manufacturing a semiconductor package, and a method of manufacturing a semiconductor package using the same. More particularly, the present invention relates to a dicing film wherein a shrinkage release film is inserted between an adhesive film for dicing a wafer and a die adhesive film so that the die adhesive film and a die can be easily separated from the adhesive film for dicing a wafer when picking up a semiconductor die, and a method of manufacturing a semiconductor package using the same.

3 Claims, 7 Drawing Sheets

DICING FILM HAVING SHRINKAGE RELEASE FILM AND METHOD FOR MANUFACTURING SEMICONDUCTOR PACKAGE USING THE SAME

CROSS-REFERENCE TO RELATED APPLICATIONS

This application is a Divisional application from application Ser. No. 11/009,246, the contents of which is hereby incorporated by reference.

BACKGROUND OF THE INVENTION

1. Field of the Invention

The present invention relates to a dicing film having an adhesive film for dicing a wafer and a die adhesive film, which are used for manufacturing a semiconductor package, and a method of manufacturing a semiconductor package using the same. More particularly, the present invention relates to a dicing film wherein a shrinkage release film is inserted between an adhesive film for dicing a wafer and a die adhesive film so that the die adhesive film and a die can be easily separated from the adhesive film for dicing the wafer when picking up a semiconductor die, and a method of manufacturing a semiconductor package using the same.

2. Background of the Related Art

Generally, a semiconductor integrated circuit is only a small and thin silicon chip but has over tens of thousands to tens of millions of electronic components (such as transistors, diodes, resistors, capacitors, etc.) contained therein. These electronic components are precisely interconnected to serve as a logical gate and a storage unit.

A semiconductor integrated circuit (IC) as a silicon chip is formed using silicon single crystal and is fabricated through a silicon wafer having one side polished like a mirror that is cut in a thickness of several hundreds of μm.

In order to fabricate a semiconductor device through a silicon wafer, a process of cutting the silicon wafer in a given shape using a die is required. This is called "dicing". It is required that the wafer be not shaken during this dicing process. At this time, a material used for fixing the wafer is a dicing film.

In case of a typical dicing film, a polyolefine adhesive sheet having an acrylic adhesive layer covered thereon is used as the adhesive film for dicing. A polyimide or epoxy adhesive film is used as the die adhesive film.

The dicing film used in the manufacture process of the semiconductor package as such must have the following requirements in order to increase the quality of the semiconductor package to be manufactured. First, it is required that the dicing film can support the die safely while a dicing process proceeds. Then, it is required that the dicing film can easily peel off the die and the die adhesive film during the pick-up process. After the pick-up process, it is necessary that adhesive components of the adhesive film for dicing do not remain on the rear of the die adhesive film.

To this end, the adhesive strength of the dicing film varies depending on external parameters. The external parameters may include heat, pressure, light, etc. Thus, the dicing film is composed of a material having heat peel-off, pressure sensitive and photoresist properties. In a conventional semiconductor package process, the dicing film is illuminated with the ultraviolet rays or heated in order to separate the die and the die adhesive film using the heat and peel-off and photoresist properties of the dicing film.

However, there occurs a problem in that the die and the die adhesive film cannot be completely separated from the adhesive film for dicing only through such annealing process or illumination of the ultraviolet rays due to the remaining adhesive strength between the die adhesive film and the adhesive film for dicing. In this case, there is a problem in that alien substances on the surface of the wafer cannot be fully removed even after picking up the die.

Furthermore, in case of the peeling by the illumination of the ultraviolet rays, there occurs a problem in that the semiconductor package manufacturing process becomes complicated since an apparatus for irradiating the ultraviolet rays is used.

SUMMARY OF THE INVENTION

Accordingly, the present invention has been made in view of the above problems occurring in the prior art, and it is an object of the present invention to provide a dicing film and method of manufacturing a semiconductor package using the same, wherein a shrinkage release film is added to a dicing film consisting of a polyolefine adhesive film for dicing and a die adhesive film and is then diced, whereby a die and the die adhesive film are easily separated from the adhesive film for dicing in a pick-up process and an adhesive matter is prevented from remaining on the rear of the die adhesive film.

To achieve the above objects, in one aspect of the present invention, there is provided a dicing film having a shrinkage release film, wherein the dicing film serves to fix a semiconductor die when a semiconductor wafer is diced, the dicing film including: a shrinkage release film made of a material that can shrink when being heated; a die adhesive film coated on one side of the shrinkage release film; and an adhesive film for dicing coupled to the other side of the shrinkage release film.

In the above, it is preferred that the shrinkage release film is made of either polyethylene terephthalate (PET) or polyethylene-2,6-naphthalenedicarboxylate (PEN), which shrinks when being heated.

Furthermore, it is preferred that the dicing film further includes a protection film formed on the top surface of the die adhesive film. It is preferable that the die adhesive film 3 has a thickness of 10 μm to 175 μm.

It is preferred that the die adhesive film is formed using a polyimide adhesive or an epoxy adhesive, and the adhesive film for dicing is formed using a polyolefine adhesive.

Moreover, it is preferred that the adhesive strength of the shrinkage release film and the adhesive film for dicing is higher than that of the shrinkage release film and the die adhesive film.

In another aspect of the present invention, there is also provided a method of manufacturing a semiconductor package, including the steps of: coating a die adhesive film on one side of a shrinkage release film, laminating a polyethylene protection film on the die adhesive film, and coupling to an adhesive film for dicing to the other side of the shrinkage release film via an adhesive layer to fabricate a dicing film (S101); peeling off the polyethylene protection film from the die adhesive film (S102); adhering the fabricated dicing film to the surface of a wafer (S103); dicing the wafer (S104); washing the diced wafer (S105); and drying the washed wafer (S106).

In the above, it is preferred that the shrinkage release film is made of either polyethylene terephthalate (PET) or polyethylene-2,6-naphthalenedicarboxylate (PEN), which shrinks when being heated.

Further, it is preferred that the step of fabricating the dicing film (S101) further includes a step of controlling the adhesive strength of the die adhesive film and the shrinkage release film by irradiating the ultraviolet rays to the shrinkage release film.

It is preferred that the step of adhering the dicing film 1 to the wafer (S103) further includes a step of compressing the wafer and the dicing film using lamination rollers that are heated at a temperature of 70° C. to 180° C.

In addition, it is preferred that the step of drying the washed wafer (S106) further includes a step of heating the wafer at a temperature of 110° C. to 200° C. after washing the wafer.

Moreover, it is preferred that wherein the step of picking up the die and then mounting the die on a PCB substrate (S107) further comprises a step of bonding the mounted die (S108) at a temperature of 100° C. to 250° C. and a pressure of 0.5 MPa to 5 MPa.

BRIEF DESCRIPTION OF THE DRAWINGS

Further objects and advantages of the invention can be more fully understood from the following detailed description taken in conjunction with the accompanying drawings in which.

DETAILED DESCRIPTION OF THE PREFERRED EMBODIMENT

A dicing film having a shrinkage release film and method of manufacturing a semiconductor package using the same according to the present invention will now be described in detail in connection with preferred embodiments with reference to the accompanying drawings.

Figure 1:
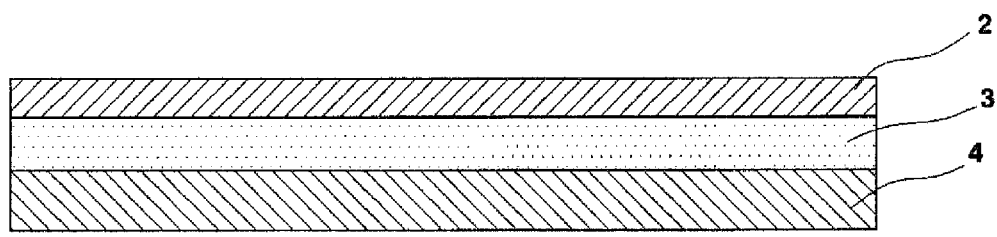
FIG. 1 is a cross-sectional view showing a die adhesive film coupled to a shrinkage release film according to the present invention.

FIG. 1 is a cross-sectional view showing a die adhesive film coupled to a shrinkage release film according to the present invention.

Referring to FIG. 1, a die adhesive film 3 has one side coated on a shrinkage release film 4 and the other side on which a polyethylene (PE) protection film 2 is laminated.

It is preferred that the die adhesive film 3 is formed using a polyimide adhesive or an epoxy adhesive so that it has a predetermined adhesive strength together with a die. It was found that the polyimide adhesive or the epoxy adhesive used as the die adhesive film 3 meets the standard ruled by JEDEC/IPC being a world semiconductor standard organization.

Further, the shrinkage release film 4 is composed of polyethylene terephthalate (PET) and polyethylene-2,6-naphthalenedicarboxylate (PEN). Polyethylene terephthalate (PET) and polyethylene-2,6-naphthalenedicarboxylate (PEN) are materials that shrink when being heated.

In order to coat the die adhesive film 3 on the shrinkage release film 4, a coater that can discharge a film material of a predetermined pitch and amount is used. By means of the coater, the die adhesive film 3 is coated on the shrinkage release film 4 in thickness of 180 μm or less, more preferably 10 μm to 175 μm. If the thickness of the die adhesive film 3 is below 10 μm, the strength that supports a die may be weak after the die is adhered on a PCB substrate. On the contrary, if the thickness of the die adhesive film 3 is over 175 μm, the size of a semiconductor package to be manufactured may be great. Accordingly, it is preferred that the thickness of the die adhesive film 3 is set within the above range.

Figure 2:
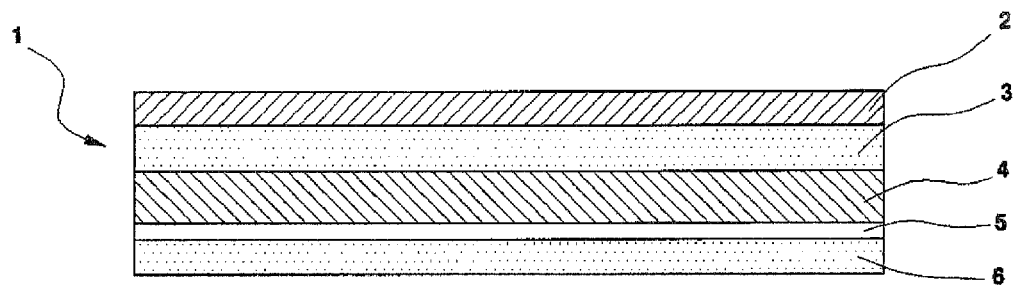
FIG. 2 is a cross-sectional view showing a dicing film having a shrinkage release film according to the present invention.

FIG. 2 is a cross-sectional view showing a dicing film 1 having the shrinkage release film according to the present invention.

Referring to FIG. 2, one side of an adhesive film for dicing 6 having an adhesive layer 5 formed thereon is attached to the remaining side of the shrinkage release film 4 except for the side on which the die adhesive film 3 is coated. At this time, the shrinkage release film 4 is composed of polyethylene terephthalate (PET) and polyethylene-2,6-naphthalenedicarboxylate (PEN) that are not yet released. The adhesive film for dicing 6 is formed using a polyolefine (PO) film.

As a result, the dicing film 1 has a structure in which the polyethylene protection film 2, the die adhesive film 3, the shrinkage release film 4, the adhesive layer 5 and the adhesive film for dicing 6 are sequentially stacked.

Figure 3:
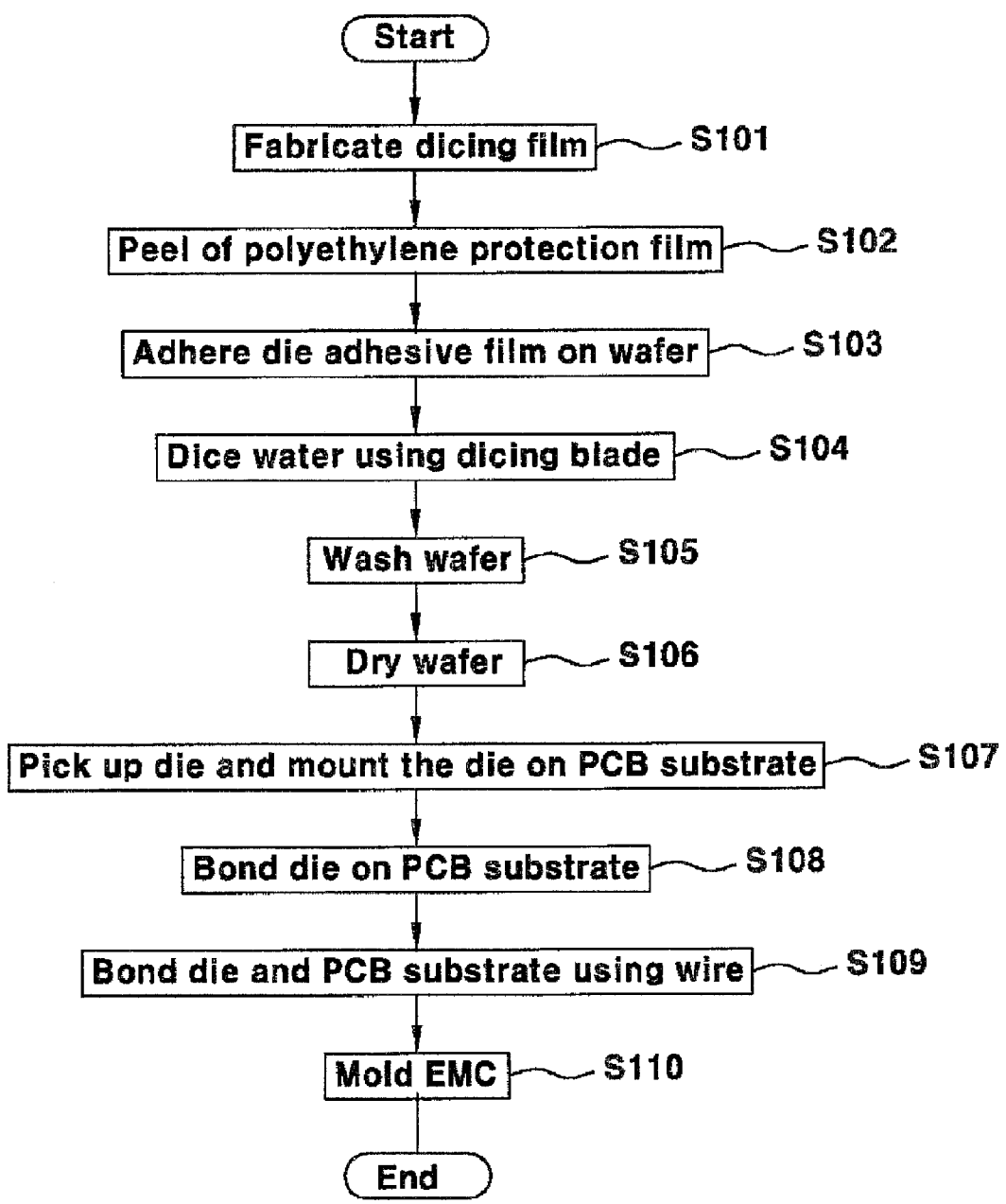
FIG. 3 is a flowchart illustrating a method of manufacturing a semiconductor package according to the present invention.
Figure 4:
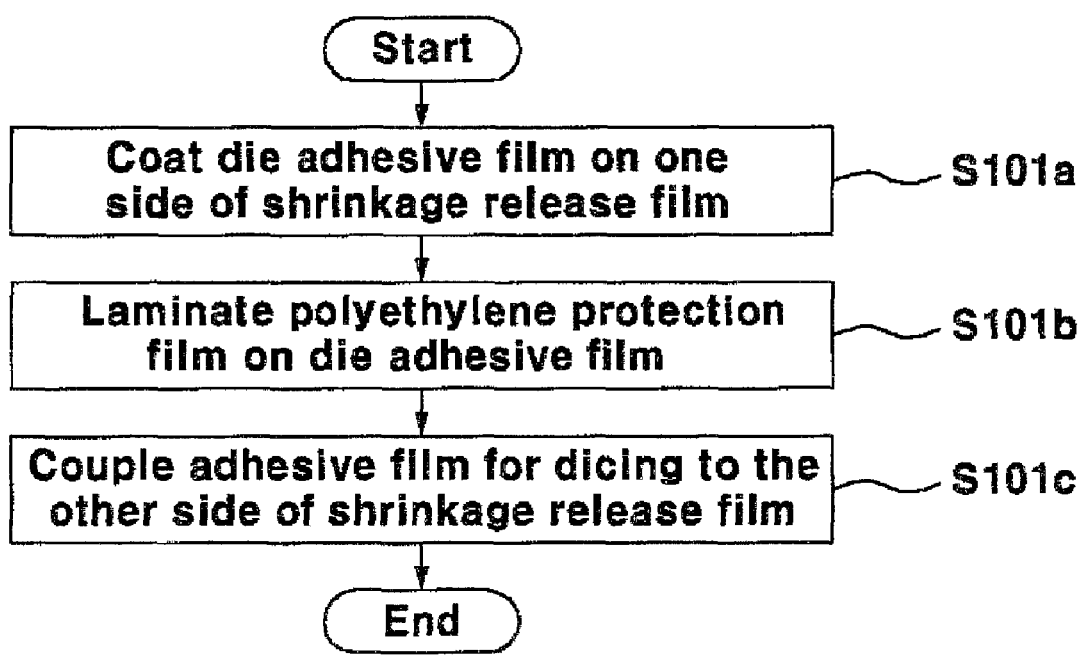
FIG. 4 is a flowchart illustrating the step (S101) of fabricating the dicing film in detail according to the present invention in the semiconductor package manufacture method.

FIG. 3 is a flowchart illustrating a method of manufacturing a semiconductor package according to the present invention. FIG. 4 is a flowchart illustrating a step (S101) of fabricating the dicing film in detail according to the present invention in the semiconductor package manufacture method.

Referring to FIG. 3, in order to manufacture the semiconductor package, the dicing film 1 is first formed (S101). In the above, the step of forming the dicing film 1 (S101) includes three coupling steps, as shown in FIG. 4.

The die adhesive film 3 is first coated on one side of the shrinkage release film 4 (S101a).

Upon coating, the linear velocity and amount of discharge of a coater are controlled so that the die adhesive film 3 has a thickness of 10 μm to 175 μm. At this time, in order for the thickness of the die adhesive film 3 to be constantly coated in the width direction, it is required that a distance between rip pads be controlled uniformly.

The die adhesive film 3 composed of a coating solution of the liquid state is heated on the shrinkage release film 4 in order to make it into a film shape. The die adhesive film 3 for which the annealing process is finished is experienced by the ultraviolet (UV) curing process in order to maintain a B-stage state not a complete hardening state. In the above, the B-stage state refers to a state that though a thermosetting resin is softened by annealing after an A-stage state of an initial reaction stage, the thermosetting resin is not melt, is swelled by a solvent but is dissolved. It is therefore possible to control the degree of the reaction state by controlling the amount of the ultraviolet rays. It is also possible to control adhesive strength between the die adhesive film 3 and the shrinkage release film 4 depending on the softening or swelling.

It is preferred that the adhesive strength between the die adhesive film 3 and the shrinkage release film 4 is 40 to 150 gf/cm, more preferably 50 to 120 gf/cm after the UV curing. In the above, when the adhesive strength is over 40 gf/cm, a minimum adhesive strength that can fix the die upon dicing can be maintained. Maintaining the adhesive strength below 150 gf/cm makes the die and the die adhesive film suitably separated when they are separated from the shrinkage release film 4 and picked up in a pick-up process since 150 gf/cm is lower than 200 gf/cm, which is a common adhesive strength between the adhesive film for dicing 6 and the shrinkage release film 4.

The polyethylene protection film 2 is then stacked on the die adhesive film 3 (S101*b*).

The polyethylene protection film 2 is a film having a moisture proof effect. This film can prevent adhesive strength of the die adhesive film 3 from dropping due to moisture. Furthermore, the polyethylene protection film 2 serves to protect the die adhesive film 3 from the coupling pressure in the process of coupling the adhesive film for dicing 6 to the other side of the shrinkage release film 4.

Lastly, the shrinkage release film 4 and the adhesive film for dicing 6 are coupled to the other side of the shrinkage release film 4 through the adhesive layer 5 formed on the adhesive film for dicing 6 (S101*c*).

The adhesive film for dicing 6 being a polyolefine (PO) film is stacked on the shrinkage release film 4 composed of polyethylene terephthalate (PET) or polyethylene-2,6-naphthalenedicarboxylate (PEN). In this case, the stacking method may include various methods that are known to a person skilled in the art. The adhesive film for dicing 6 and the shrinkage release film 4 are preferably compressed by a lamination roller.

If the shrinkage release film 4 and the adhesive film for dicing 6 are coupled, it is required that the adhesive strength between the shrinkage release film 4 and the adhesive film for dicing 6 be kept 200 gf/cm or more, preferably 250 gf/cm or more, more preferably 500 gf/cm or more. By maintaining the adhesive strength between the shrinkage release film 4 and the adhesive film for dicing 6 high as such, the die can be fixed in a strong adhesive strength upon dicing.

The polyethylene protection film 2, the die adhesive film 3 and the shrinkage release film 4 combined as above are stacked on the adhesive layer 5 on the adhesive film for dicing 6 in order to dice a wafer.

Thereafter, the polyethylene protection film 2 of the dicing film 1 manufactured by the above process is peeled off (S102). This process is for exposing the die adhesive film 3 outwardly and adhering the die adhesive film 3 and the semiconductor device wafer.

The die adhesive film 3 exposed outwardly as such is adhered to a semiconductor device wafer 10 (S103).

Figure 5:
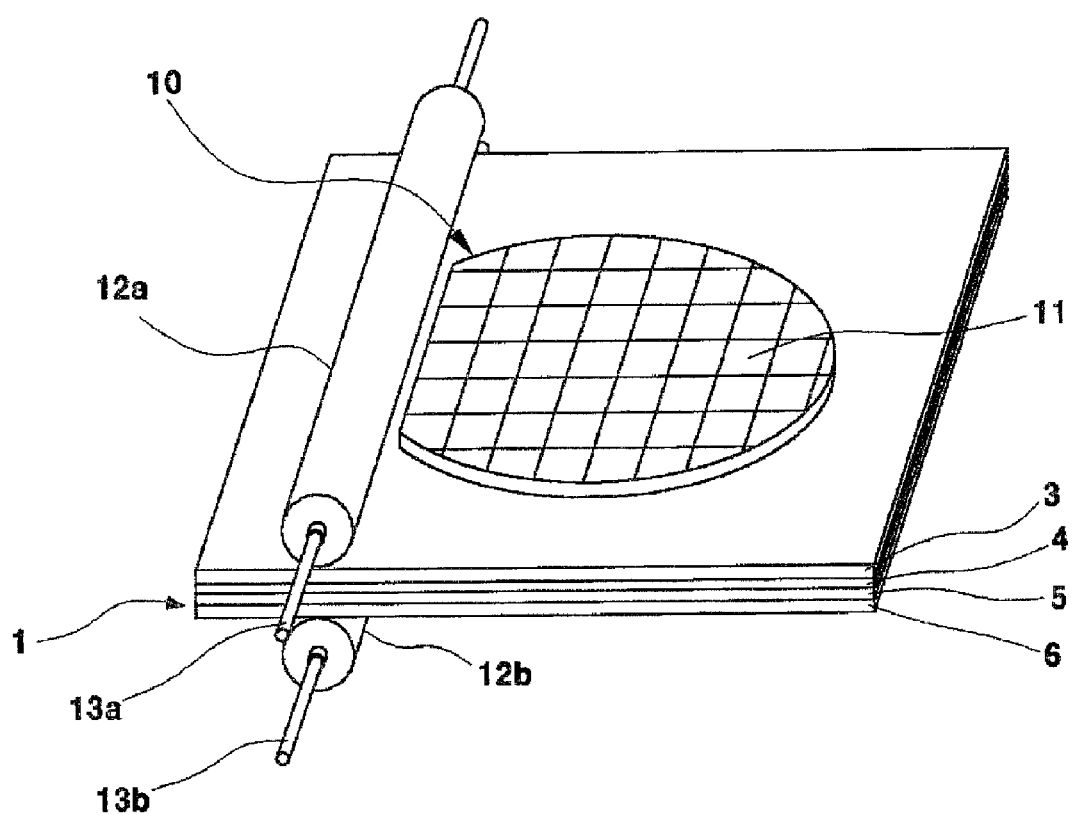
FIG. 5 schematically shows a process of adhering a wafer and a die adhesive film using a lamination roller.

FIG. 5 schematically shows the process of adhering the wafer 10 and the die adhesive film 3 using lamination rollers 12*a* and 12*b*.

Referring to FIG. 5, in order to adhere the die adhesive film 3 and the wafer 10, the lamination rollers 12*a* and 12*b* to which a predetermined temperature is applied compress the die adhesive film 3 and the wafer 10. Each of the lamination rollers 12*a* and 12*b* has its central axis connected to each of pivots 13*a* and 13*b* and a bearing (not shown) for rotary movement.

In the above, it is preferred that the lamination rollers 12*a* and 12*b* have a temperature of 70° C. to 180° C., more preferably 80° C. to 160° C. The reason why the temperature of the lamination rollers 12*a* and 12*b* is controlled within the same range is for increasing the adhesive strength while not significantly damaging the semiconductor device wafer. Also, the transfer speed of the lamination roller is preferably 1 to 5 m/min in order to apply a sufficient press power between the die adhesive film 3 and the wafer 10.

Thereafter, the wafer 10 and the die adhesive film 3, the shrinkage release film 4, the adhesive layer 5 and the adhesive film for dicing 6 are sequentially stacked.

Next, in order to cut the wafer in a given size, the wafer is diced using a dicing blade (S104).

Figure 6:
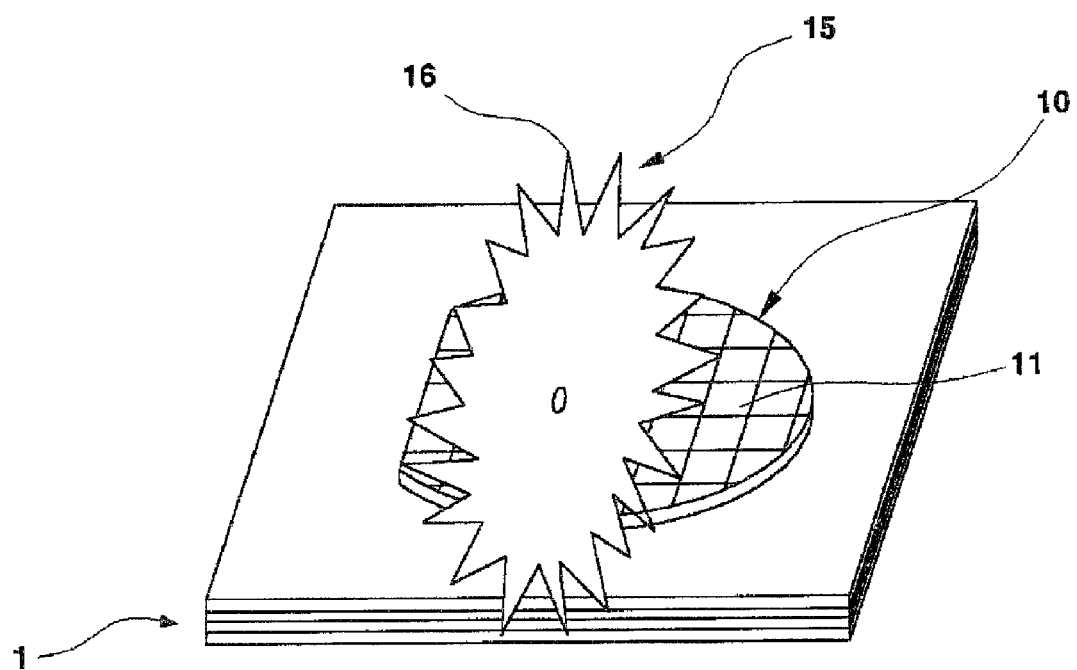
FIG. 6 schematically shows a dicing process according to the present invention.

FIG. 6 schematically shows the dicing process according to the present invention;

Referring to FIG. 6, the wafer 10 attached to the dicing film 1 is cut into a plurality of dies 11, which are arranged in the horizontal and vertical directions, by means of a dicing blade 15. In the above, a blade 16 has a die diamond chip built in order to improve the cutting performance.

After the wafer is cut through the dicing, residues remain on the face of the wafer. In order to remove the residues, the wafer is washed (S105).

The process of washing the wafer preferably includes immersing the wafer 10 into a tank containing a washing agent in order to more cleanly wash the wafer and then applying ultrasonic vibration to the washing agent so that the residues are removed.

The wafer 10 is then dried (S106). The dry process is implemented in two steps. Dry air is first injected into the surface of the wafer 10 in order to evaporate moisture remaining on the surface of the wafer.

The wafer 10 is heated preferably in a temperature range of 110° C. to 200° C. for 1 to 5 minutes. In this case, if the wafer is heated at a temperature of 110° C. or less, there occurs a problem in that remaining moisture is not completely removed after washing. Meanwhile, if the wafer is heated at a temperature of 200° C. or more, there occurs a problem in that the adhesive strength between the wafer 10 and the die adhesive film 3 is weakened due to the high temperature. The above dry process not only removes the remaining moisture through a heating effect, but also strengthens the adhesive strength between the wafer 10 and the die adhesive film 3. It also generates a dehydration and condensation reaction of a silanol (SiOH) radical within the die adhesive film 3, so that the adhesive strength becomes weak at the interface between the shrinkage release film 4 and the die adhesive film 3. In the above, the dehydration and condensation reaction is a reaction in which new molecules are formed as moisture is drained between two molecules.

In particular, it is well known that the polyethylene terephthalate (PET) or polyethylene-2,5-naphthalenedicarboxylate (PEN) film used as the shrinkage release film 4 shrinks when being heated. Therefore, the shrinkage release film 4 is applied with a high internal stress due to the compression stress within the film, which is higher than those of the die 11 and the die adhesive film 3 when being thermally dried.

This condition can be attributed to a difference in the coefficient of thermal expansion (CTE). The coefficient of thermal expansion of the shrinkage release film 4 composed of polyethylene terephthalate (PET) or polyethylene-2,6-naphthalenedicarboxylate (PEN) is higher than that of the die 11. Thus, when being heated, the shrinkage release film 4 is relatively more thermally deformed than the die 11. In this case, since a relatively higher compression stress is applied to the shrinkage release film 4, the shrinkage release film 4 is bent. Therefore, the adhesion area between the shrinkage release film 4 and the die adhesive film 3 decreases to lower the adhesive strength therebetween.

By means of the annealing and dry process according to the present invention, the adhesive strength between the die adhesive film 3 and the shrinkage release film 4 decreases to 15 gf/cm or less, preferably 13 gf/cm or less.

Next, the die 11 and the die adhesive film 3 are picked up and are then mounted on a PCB substrate 20 for fabricating a semiconductor package (S107).

Figure 7:
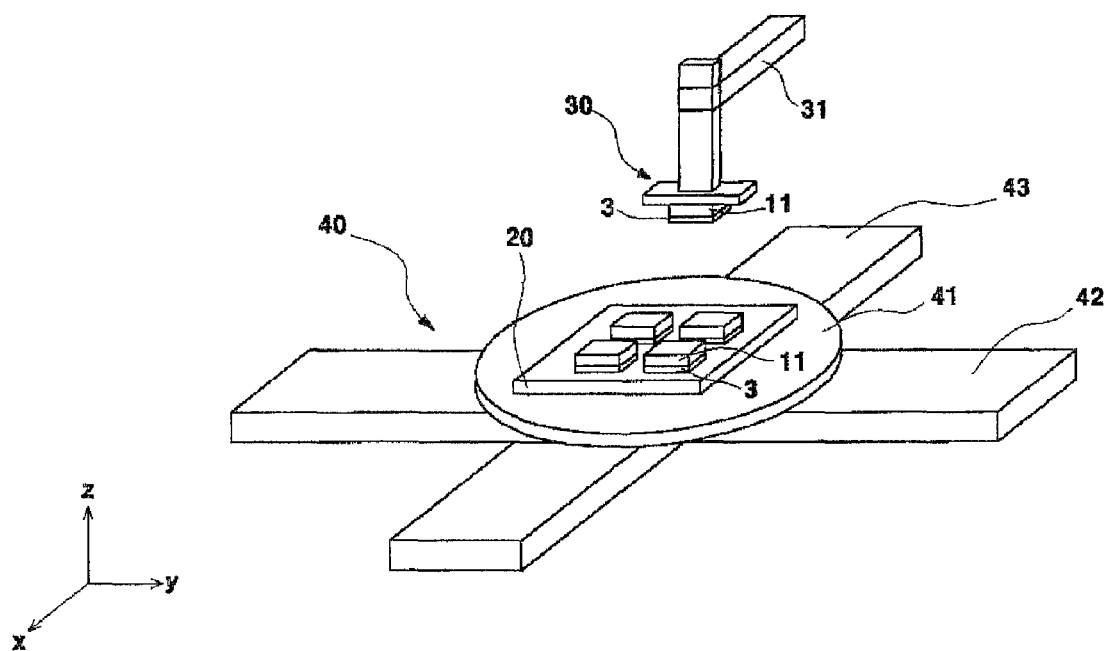
FIG. 7 schematically shows a process of mounting a semiconductor device chip.

FIG. 7 schematically shows the process of mounting the semiconductor device chip.

Referring to FIG. 7, a device for picking up the semiconductor device chips is a suction collet 30. The suction collet 30 has a predetermined suction power and attaches the die 11 and the die adhesive film 3 on the suction surface. For this purpose, a vacuum tube (not shown) for sucking the air and compressing the die 11 is disposed within the suction collet 30.

The suction collet 30 is connected to a guide arm 31 for guiding the die 11 attached thereto toward a predetermined mounting position on the PCB substrate 20. The guide arm 31 is connected to a movable means (not shown) that can preferably rotate around the z-axis shown in FIG. 7 and perform a rectilinear movement against a z-y plane or a z-x plane.

In order to determine the mounting position of the semiconductor device chip, there is preferably provided a mounting position control table 40. The mounting position control table 40 includes a rotary table 41 for rotating the PCB substrate 20 around the z axis shown in FIG. 7, and an x axis transfer table 43 and a y axis transfer table 42 for transferring the PCB substrate 20 in the x axis or the y axis on the x-y plane.

By means of the mounting position control construction that performs the rectilinear movement and the rotary movement on the x-y plane, the semiconductor die 11 can be mounted at a position on a predetermined x-y plane of the PCB substrate 20.

After the die is mounted on the PCB substrate, the mounted die is bonded to the PCB substrate at a predetermined temperature and a given pressure (S108).

This bonding process is a process for increasing the adhesive strength of the die adhesive film 3 so that the die 11 is adhered and fixed to the PCB substrate 20.

In this bonding process, a predetermined pressure is applied between the die adhesive film 3 and the PCB substrate at a determined temperature. During this bonding process, it is preferred that heat of 100 to 250° C. in temperature and a pressure of 0.5 to 5 Mpa are applied between the die adhesive film 3 and the PCB substrate for 0.5 to 5 seconds. Furthermore, it is more preferable that heat of 120 to 200° C. in temperature is applied at a pressure of 1 to 4 Mpa for 0.5 to 4 seconds. In the above, if the temperature is 100° C. or less, the adhesive strength can be lowered. If the temperature is 250° C. or more, the die adhesive film can be severely deformed due to the high heat. Moreover, if the pressure is 0.5 Mpa or less, it is difficult to sufficiently compress the die adhesive film having a predetermined adhesive strength on the PCB substrate. If the pressure is 4 Mpa or more, a circuit pattern formed in the die can be damaged.

Thereafter, the semiconductor die is bonded using wires (S109).

Figure 8:
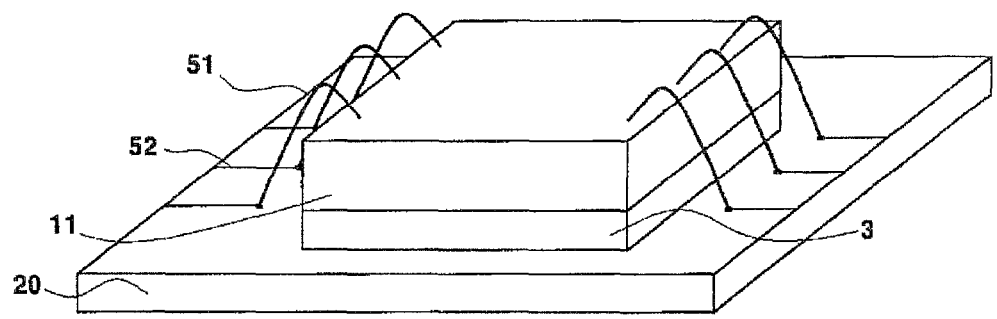
FIG. 8 schematically shows a process of bonding a PCB substrate and a semiconductor die using wires.

FIG. 8 schematically shows the process of bonding the PCB substrate and the semiconductor die using the wires.

Referring to FIG. 8, bonding wires 51 are connection materials for connecting the semiconductor die 11 and inner leads 52 of the PCB substrate 20 that supports the semiconductor die 11. Thus, the semiconductor die 11 and the inner leads 52 are electrically connected.

The bonding wires 51 are thin conductive lines made of Au, Al or Cu. This wire bonding is formed by means of a thermocompression method in which wires are melted by means of electric discharge, a welding method such as an ultrasonic welding method in which wires are connected by means of ultrasonic vibration of an ultrasonic welder and so on.

After the wire bonding, the semiconductor die is molded using an epoxy-molding compound (EMC) (S110).

Figure 9:
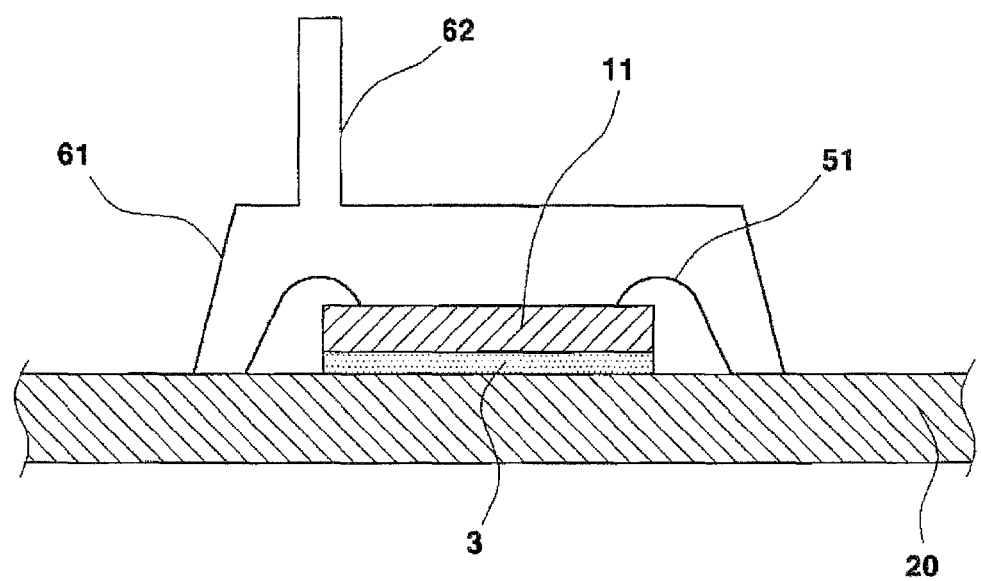
FIG. 9 is a cross-sectional view showing a process of molding the semiconductor die.

FIG. 9 is a cross-sectional view showing the process of molding the semiconductor die.

Referring to FIG. 9, in order to mold the semiconductor die 11, a molding cast 61 having a desired molding shape is covered around the semiconductor die.

An EMC inlet 62 being a passage through which an EMC is injected is formed at one upper side of the molding cast 61. Therefore, the EMC heated up to a predetermined temperature is injected into the EMC inlet 62, and then cooled and fixed according to the shape of the molding cast 61. After the EMC is cooled and fixed by some degree, the molding cast 61 is removed and the remaining EMC formed in the EMC inlet 62 is then removed.

The semiconductor package is thus completed through the aforementioned steps S101 to S110.

The present inventor performed experiments under the following conditions by changing various factors related to the respective steps according to the present invention.

In the following four experiments, a polyolefine (PO) film is used as the adhesive film for dicing 6. A polyethylene terephthalate (PET) film or a polyethylene-2,6-naphthalene-dicarboxylate (PEN) film is used as the shrinkage release film 4. The adhesive strength between the die adhesive film 3 and the shrinkage release film 4 before the dry process is approximately 100 gf/cm. Table 1 shows experimental conditions in a comparative example 1, which do not meet the conditions of the present invention, and experimental conditions in embodiments 1, 2 and 3, which meet the conditions of the present invention. At this time, the bonding process is performed by heating and compressing a core on a PCB substrate made of a bismaleimide triazine resin at a pressure of 1.5 MPa and temperature of 160° C. for 1.5 second.

TABLE 1

|  | Shrinkage release film | Thickness (μm) of die adhesive film | Temperature (° C.) of lamination roller | Heating temperature (° C.) of dry process | Heating time (minutes) of dry process |
| --- | --- | --- | --- | --- | --- |
| Comparative Example 1 | PET film | 25 | 80 | 100 | 5 |
| Example 1 | PET film | 40 | 90 | 120 | 2 |
| Example 2 | PET film | 50 | 100 | 120 | 5 |
| Example 3 | PEN film | 50 | 100 | 120 | 5 |

Table 1 shows that the experimental conditions according to the present invention are compared with the Comparative Example 1, and the Examples 1, 2 and 3.

In the above, a heating temperature used in the dry process of the present invention was 100° C. in case of the Comparative Example 1 and 120° C. in case of the Examples 1, 2 and 3.

In order to confirm whether the heating time of the dry process affects the present invention, 5 minutes was spent in the Comparative Example 1 and the Example 2 and 3, and 2 minutes was spent in the Example 1.

Various experiments were performed in order to know whether the conditions according to the present invention were satisfied. A polyethylene terephthalate (PET) film was used as the shrinkage release film 4 in the Comparative Example 1, and the Example 1 and 2, and polyethylene-2,6-naphthalenedicarboxylate (PEN) is used as the shrinkage release film 4 in the Example 3.

Further, a thickness of the die adhesive film 3 was 25 μm in the Comparative Example 1, 40 μm in the Example 1, and 50 μm in the Example 2 and 3.

Test results of the peel strength depending on the above experimental conditions are as follows. Resulting values indicate values for measuring the adhesive strength and are measured as values of PS (Peel Strength).

TABLE 2

|  | PS (gf/cm) between die and die adhesive film | PS (gf/cm) between die adhesive film and shrinkage release film before dry process | PS (gf/cm) between die adhesive film and shrinkage release film after dry process |
|---|---|---|---|
| Comparative Example 1 | 174 | 76 | 34 |
| Example 1 | 190 | 89 | 7 |
| Example 2 | 205 | 98 | 11 |
| Example 3 | 203 | 97 | 10 |

Table 2 shows the values of the peel strength measured for the above experiments.

From Table 2, it can be seen that predetermined results required in the present invention are relatively significantly changed depending on the temperature of the dry process according to the present invention, compared to other experimental condition factors.

As shown in Table 2, in the Comparative Example 1, and the Examples 1, 2 and 3, the PS values between the die 11 and the die adhesive film 3 were measured within a range of 150 gf/cm to 300 gf/cm, which is a preferred condition of the PS value between the die 11 and the die adhesive film 3 according to the present invention.

As described above, in order to accomplish the object of the present invention, the adhesive strength between the die adhesive film 3 and the shrinkage release film 4 must be reduced to 15 gf/cm or less after the dry process.

As shown in the experimental results, in case of the Comparative Example 1, the PS value between the die adhesive film 3 and the shrinkage release film 4 is reduced from 76 gf/cm before the dry process to 34 gf/cm after the dry process. On the contrary, in case of the Examples 1, 2 and 3, it was found that the PS value is reduced from 85 gf/cm to 100 gf/cm before the dry process to approximately 5 gf/cm to 12 gf/cm after the dry process. Therefore, in case of the Comparative Example 1, the PS value between the die adhesive film 3 and the shrinkage release film 4 after the dry process did not decrease to 15 gf/cm or less unlike the Examples 1, 2 and 3. This means that in the Comparative Example 1, the PS value between the die adhesive film 3 and the shrinkage release film 4 does not meet 15 gf/cm upon pick-up being a preferred condition of the present invention, but a preferred embodiment of the present invention satisfies 15 gf/cm.

From Table 2, it can be seen that in the Comparative Example 1, the adhesive strength between the die adhesive film 3 and the shrinkage release film 4 in the dicing process before the dry process was 50 gf/cm to 120 gf/cm, but the adhesive strength between the die adhesive film 3 and the shrinkage release film 4 after the dry process did not decrease to 15 gf/cm or less. On the contrary, it was found that in the Examples 1, 2 and 3, the adhesive strength between the die adhesive film 3 and the shrinkage release film 4 drops from 50 to 120 gf/cm before the dry process to 15 gf/cm after the dry process. Through the above, it can be seen that the heating temperature of the dry process has a great influence on the adhesive strength between the die adhesive film 3 and the shrinkage release film 4 after the dry process in the method according to the present invention.

As a result, according to Examples of the present invention, it was found that the shrinkage release film 4 has a relatively high adhesive strength against the die adhesive film 3 in the dicing process and has a low adhesive strength with the die adhesive film 3 in the pick-up process. Therefore, if the dicing film fabricated according to the present invention is used, the die 11 and the die adhesive film 3 can be easily separated from the adhesive film for dicing 6.

According to the present invention as described above, a dicing film has a predetermined adhesive strength with a wafer in the process of dicing a semiconductor device wafer. It can thus support the semiconductor device wafer in a stable manner.

Furthermore, in a dicing film according to the present invention, a shrinkage release film is added to the dicing film consisting of a polyolefine adhesive film for dicing and a die adhesive film. Thus, in the pick-up process after a wafer is diced, a die and a die adhesive film can be easily separated from the adhesive film for dicing, and an adhesive matter is prevented from being contaminated on the rear of the die adhesive film.

Moreover, the die can be easily separated in picking up the die without an additional UV curing process through the heat and peel-off, photoresist and pressure-sensitive properties of the shrinkage release film.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. A method of manufacturing a semiconductor package, comprising the steps of:
    coating a die adhesive film on one side of a shrinkage release film, the shrink release film is made of polyethylene-2,6-naphthalenedicarboxylate,
    controlling the adhesive strength of the die adhesive film and the shrinkage release film to have an adhesive strength of 40-150 gf/cm by irradiating the shrinkage release film with ultraviolet radiation,
    laminating a polyethylene protection film on the die adhesive film, and coupling to an adhesive film for dicing to the other side of the shrinkage release film via an adhesive layer to fabricate a dicing film;
    peeling off the polyethylene protection film from the die adhesive film;
    adhering the fabricated dicing film to the surface of a wafer;
    dicing the wafer;
    washing the diced wafer;
    drying the washed wafer;
    picking up the die and mounting the die on a PCB substrate;
    bonding the mounted die at a temperature of 100° C. to 250° C. and a pressure of 0.5 MPa to 5 Mpa.

2. The method as claimed in claim 1, wherein the step of adhering the dicing film 1 to the wafer further comprises a step of compressing the wafer and the dicing film using lamination rollers that are heated at a temperature of 70° C. to 180° C.

3. The method as claimed in claim 1, wherein the step of drying the washed wafer further comprises a step of heating the wafer at a temperature of 110° C. to 200° C. after washing the wafer.

* * * * *